United States Patent
Gustavsson et al.

(10) Patent No.: US 10,306,348 B2
(45) Date of Patent: May 28, 2019

(54) MUTE PATTERN INJECTION FOR A PULSE-DENSITY MODULATION MICROPHONE

(71) Applicant: QUALCOMM Incorporated, San Diego, CA (US)

(72) Inventors: Bengt Stefan Gustavsson, San Diego, CA (US); Hui-Ya Liao Nelson, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 49 days.

(21) Appl. No.: 15/611,657

(22) Filed: Jun. 1, 2017

(65) Prior Publication Data

US 2018/0234064 A1    Aug. 16, 2018

Related U.S. Application Data

(60) Provisional application No. 62/460,011, filed on Feb. 16, 2017.

(51) Int. Cl.
*H03G 3/34* (2006.01)
*H04R 1/08* (2006.01)
(Continued)

(52) U.S. Cl.
CPC ............ *H04R 1/08* (2013.01); *G10L 19/018* (2013.01); *G10L 21/0216* (2013.01); *H03G 3/34* (2013.01);
(Continued)

(58) Field of Classification Search
CPC ............ H03G 3/20; H03G 3/348; H03G 3/34; H03M 3/376; G10L 19/005; G10L 15/30
(Continued)

(56) References Cited

U.S. PATENT DOCUMENTS 8,681,853 B2 *  3/2014  Dooper ................. H03M 3/376
                                                                               375/217
9,478,234 B1 * 10/2016  Nandy ...................... G10L 15/30
(Continued)

FOREIGN PATENT DOCUMENTS

EP           2911303 A1    8/2015
WO       2016179392 A1   11/2016

OTHER PUBLICATIONS

International Search Report and Written Opinion—PCT/US2017/067924—ISA/EPO—dated Feb. 13, 2018.

*Primary Examiner* — Paul Kim
*Assistant Examiner* — Ubachukwu A Odunukwe
(74) *Attorney, Agent, or Firm* — Colby Nipper/Qualcomm

(57) ABSTRACT

Techniques for mute pattern injection for a pulse-density modulation microphone are described. In one or more implementations, a pulse-density modulation (PDM) microphone includes a transducer that receives a pressure wave and produces an analog signal that represents the pressure wave, an analog-to-digital converter (ADC) that receives the analog signal from the transducer and converts the analog signal into a digital PDM signal. The PDM microphone also includes a pattern generator that generates a digital mute signal, a controller that outputs control signals, and a multiplexer that receives the control signals, the digital mute signal, and the digital PDM signal. The multiplexer transmits the digital mute signal or the digital PDM signal, responsive to the control signals.

30 Claims, 8 Drawing Sheets

(51) Int. Cl.
  *H04R 3/00* (2006.01)
  *G10L 21/0216* (2013.01)
  *H04R 1/04* (2006.01)
  *G10L 19/018* (2013.01)
  *G10L 19/005* (2013.01)
  *G10L 15/30* (2013.01)

(52) U.S. Cl.
  CPC ............... *H03G 3/348* (2013.01); *H04R 1/04* (2013.01); *H04R 3/00* (2013.01); *G10L 15/30* (2013.01); *G10L 19/005* (2013.01); *H03F 2200/345* (2013.01)

(58) Field of Classification Search
  USPC ......................................... 381/107, 106, 104
  See application file for complete search history.

(56) References Cited

U.S. PATENT DOCUMENTS

| | | | |
|---|---|---|---|
| 2006/0013413 A1* | 1/2006 | Sakaidani | H03G 3/348 |
| | | | 381/104 |
| 2009/0259671 A1* | 10/2009 | Garudadri | G10L 19/005 |
| 2011/0255709 A1 | 10/2011 | Nishimura et al. | |
| 2013/0058495 A1 | 3/2013 | Furst et al. | |
| 2015/0127333 A1 | 5/2015 | Ubale | |
| 2016/0344358 A1 | 11/2016 | Oliaei | |

\* cited by examiner

MUTE PATTERN INJECTION FOR A PULSE-DENSITY MODULATION MICROPHONE

PRIORITY APPLICATION

This application claims priority under 35 U.S.C. § 119(e) to U.S. Provisional Patent Application Ser. No. 62/460,011, titled "Mute Pattern Injection for a Pulse Density Modulation Microphone", filed on Feb. 16, 2017, the disclosure of which is incorporated by reference herein in its entirety.

TECHNICAL FIELD

This disclosure relates generally to digital microphones, and more specifically to apparatuses and techniques to address the problem of startup period delay in pulse-density modulation (PDM) microphones.

BACKGROUND

A pulse-density modulation (PDM) microphone is a type of digital microphone that is used in many common devices, including mobile phones. PDM microphones use a digital signal (ones and zeros), referred to as a PDM signal, to represent an analog signal. In PDM signals, a density of a particular value of the digital signal (e.g., a value of one) corresponds to the amplitude of the analog signal. In other words, the peaks of the analog signal correspond to a higher density of ones in the PDM signal, while the troughs of the analog signal correspond to a lower density of ones (or a higher density of zeros). Thus, a flat analog input at the maximum amplitude level (e.g., Vdd) corresponds to a stream of ones, a flat analog input at the midpoint (e.g., 0 volts) corresponds to an equal number of alternating zeros and ones, and a flat analog input at the minimum level (e.g., −Vdd) corresponds to a stream of zeros, as described below.

Typically, PDM microphones only produce valid data once a threshold amount of analog input has been sampled. Thus, PDM microphones produce no valid output during a startup period that begins when power and a clock signal are provided to the microphone and ends when enough samples of the input have been taken. As noted, the output from a PDM microphone is either one or zero, which may be interpreted by downstream signal processing circuitry as one and negative one, respectively. Consequently, the startup period can cause problems in the signal processing circuitry because, as there is no valid output, the signal from the microphone during the startup period constitutes a stream of zeros. As noted, the zeros will be interpreted by the signal processing circuitry as negative one, which corresponds to a DC signal with the maximum negative amplitude, which can produce undesired effects, such as an audible click when the output is reproduced as sound.

SUMMARY

Techniques for mute pattern injection for a pulse-density modulation microphone are described. In one or more aspects, a pulse-density modulation (PDM) microphone includes a transducer configured to receive a pressure wave and produce an analog signal that represents the pressure wave and an analog-to-digital converter (ADC) configured to receive the analog signal from the transducer and convert the analog signal to produce a digital PDM signal. The PDM microphone also includes a pattern generator configured to generate a digital mute signal and a multiplexer. The multiplexer is configured to receive the digital mute signal from the pattern generator, receive the digital PDM signal from the ADC and, responsive to a control signal, stop transmitting the digital mute signal and begin transmitting the digital PDM signal.

In other aspects, methods for implementing mute pattern injection for a pulse-density modulation microphone are described. A pulse-density modulation (PDM) microphone receives power and a clock signal. A transducer receives a pressure wave and produces an analog signal that represents the pressure wave. An analog-to-digital converter (ADC) receives the analog signal from the transducer and converts the analog signal to produce a digital PDM signal. A pattern generator generates a digital mute signal. A multiplexer receives the digital mute signal. The multiplexer also receives the digital PDM signal and, in response to a control signal, ceases to transmit the digital mute signal and transmits the digital PDM signal.

In still other aspects, a system for implementing mute pattern injection for a pulse-density modulation microphone is described. A pattern generator is configured to generate a digital mute signal. A multiplexer is configured to receive the digital mute signal from the pattern generator, and receive a digital PDM signal. In response to a control signal, the multiplexer is configured to stop transmitting the digital mute signal and begin transmitting the digital PDM signal.

In yet other aspects, methods and systems for implementing mute pattern injection for a pulse-density modulation microphone are described. A pulse-density modulation (PDM) microphone includes a transducer configured to receive a longitudinal wave and produce an analog signal that represents the longitudinal wave and an analog-to-digital converter (ADC) configured to receive the analog signal from the transducer and convert the analog signal to produce a digital PDM signal. The PDM microphone also includes a pattern generator configured to generate a digital mute signal that has a DC average value that varies over time, within a threshold, and around a DC offset of the PDM microphone. The PDM microphone also includes means for receiving the digital mute signal from the pattern generator and the digital PDM signal from the ADC. In response to a control signal, the means is configured to stop transmitting the digital mute signal and begin transmitting the digital PDM signal.

BRIEF DESCRIPTION OF DRAWINGS

The details of various aspects are set forth in the accompanying figures and the detailed description that follows. In the figures, the left-most digit(s) of a reference number identifies the figure in which the reference number first appears. The use of the same reference numbers in different instances in the description and the figures may indicate similar or identical items. Entities represented in the figures may be indicative of one or more entities and thus reference may be made interchangeably to single or plural forms of the entities in the discussion.

DETAILED DESCRIPTION

Overview

Figure 1:
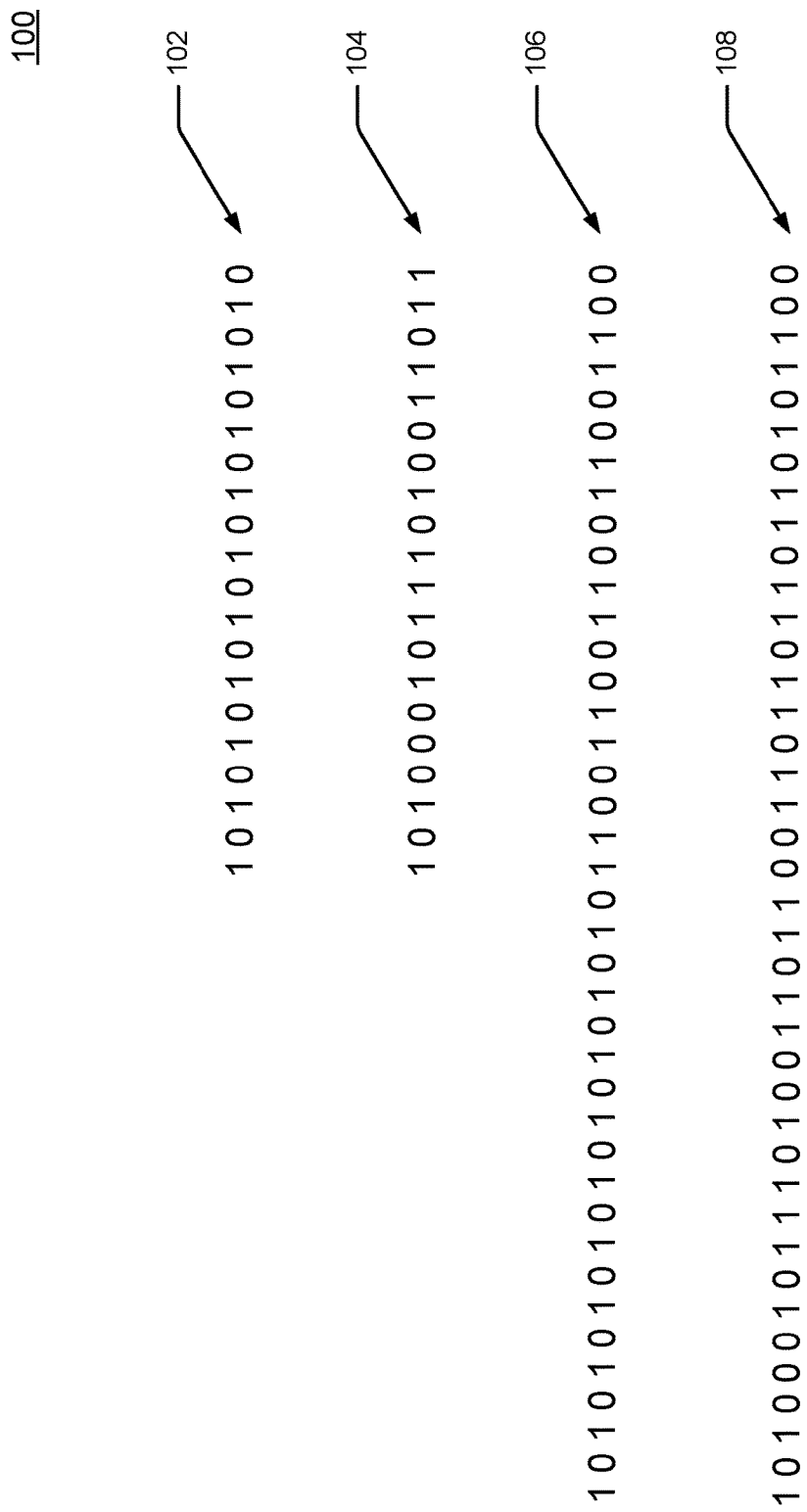
FIG. 1 illustrates multiple example patterns of a digital mute signal.

Pulse-density modulation (PDM) microphones are a type of digital microphone often used in many common electronic devices, including mobile phones. PDM microphones provide several advantages over analog microphones. For example, because PDM microphones perform the analog-to-digital conversion in the microphone, rather than in a separate processing element, the output from the PDM microphone to the downstream signal processing circuitry is a digital signal, which is generally less susceptible to some kinds of radio frequency interference produced by wireless transmitters or liquid crystal display (LCD) screens. Typically, however, a PDM microphone requires some time to sample the analog input it receives before it can begin transmitting the digital output. This startup period begins when power and a clock signal are provided to the microphone and ends when enough samples of the input have been taken to produce a valid output. No valid output is transmitted during this startup period, which can be fairly long in some PDM microphones, even as long as 10 milliseconds (ms) or more.

As noted, the output from a PDM microphone is either one or zero. The ones and zeros may be interpreted in different ways by a processing circuit that receives the output from the PDM microphone. For example, each one and zero may be interpreted as one and negative one, respectively. This can introduce problems in the processing circuitry during the startup period because the period of non-valid output is represented by a stream of zeros. Each zero in this example will be interpreted by the processing circuitry as a negative one, which corresponds, in the processing circuitry, to a DC signal with the maximum negative amplitude. When reproduced, this startup signal can produce undesired effects in the audio output, such as an audible click.

To address these problems, techniques for mute pattern injection for a pulse-density modulation microphone are described. For example, a pattern generator can be used to generate a digital mute signal that replaces the output data stream of the PDM microphone during the startup period. Generally, the digital mute signal is produced only during the startup period. By using the digital mute signal during the startup period, the undesired effects described above are mitigated because the digital mute signal replaces the stream of zeros.

Generally, the digital mute signal is a digital signal in which the number of ones and zeros is substantially the same. In various implementations, however, the numbers of ones and zeros may differ and/or the pattern of the ones and zeros may differ. In some implementations, the digital mute signal can be a signal in which the DC average is a constant. For example, the DC average of the digital mute signal may be zero or a DC offset of the PDM microphone. The DC offset is an offset of a mean amplitude of a signal transmitted by the PDM microphone relative to zero. The value of the DC offset is a characteristic particular to each PDM microphone. In other implementations, the DC average value of the digital mute signal may vary over time, within a threshold, around a target value, as described below (e.g., the digital mute signal may be comprised of multiple concatenated signals with different DC averages values that remain within another threshold of the target value). As noted, any of a variety of DC average values may be used, so long as the DC average value is small (e.g., near zero where "0" is treated as "−1" or near 0.5 where "0" is treated as "0"), to avoid a large difference between the DC average value of the digital mute signal and the beginning of the valid data. For example, the DC average value may be within a threshold of the DC offset (e.g., between 95 percent and 105 percent of the DC offset or between 85 percent and 115 percent of the DC offset).

FIG. 1 shows several example patterns 100 of a digital mute signal. An example digital mute signal 102 illustrates the general case in which the number of ones and zeros is substantially the same. Continuing with the example described above, in which each "0" is treated as "−1" by the processing circuitry, the DC average value of the example digital mute signal 102 is zero because the number of "1s" and "−1s" is the same. Conversely, in another example digital mute signal 104, there are eleven "1s" and nine "−1s" and therefore the DC average value of the other example digital mute signal 104 is 0.1.

The digital mute signal pattern may also vary over the startup time, as long as the DC average of the digital mute signal stays relatively flat. Consider a concatenated example digital mute signal 106. Even though the pattern varies (beginning with "1 0 1 0 1 0 1 0 . . . " and switching to "1 1 0 0 1 1 0 0 . . . " the concatenated example digital mute signal 106 is equivalent to the example digital mute signal 102 because each has the same the number of "1s" and "−1s" and each has a DC average value of zero. Likewise, another concatenated example digital mute signal 108 is equivalent to the other example digital mute signal 104 because the proportion of "1s" and "−1s" is the same and the DC average value of both examples is 0.1, even though the pattern varies over its length.

The techniques described in this document enable PDM microphone designs that overcome the electronic and/or audio problems introduced by the startup period inherent to PDM microphones, as described above. The techniques can be implemented within a PDM microphone package and thus do not require additions or modifications to other signal processing components to which the PDM microphone is connected, thereby saving space and processing resources. Further, the digital mute signal solutions described in these techniques and methods do not require tuning or customization for the particular PDM microphone in which the solutions are used. Instead, the solution can be successfully implemented without prior knowledge of the microphone properties, even though the length of the startup period can vary between microphones.

Operating Environment

Figure 2:
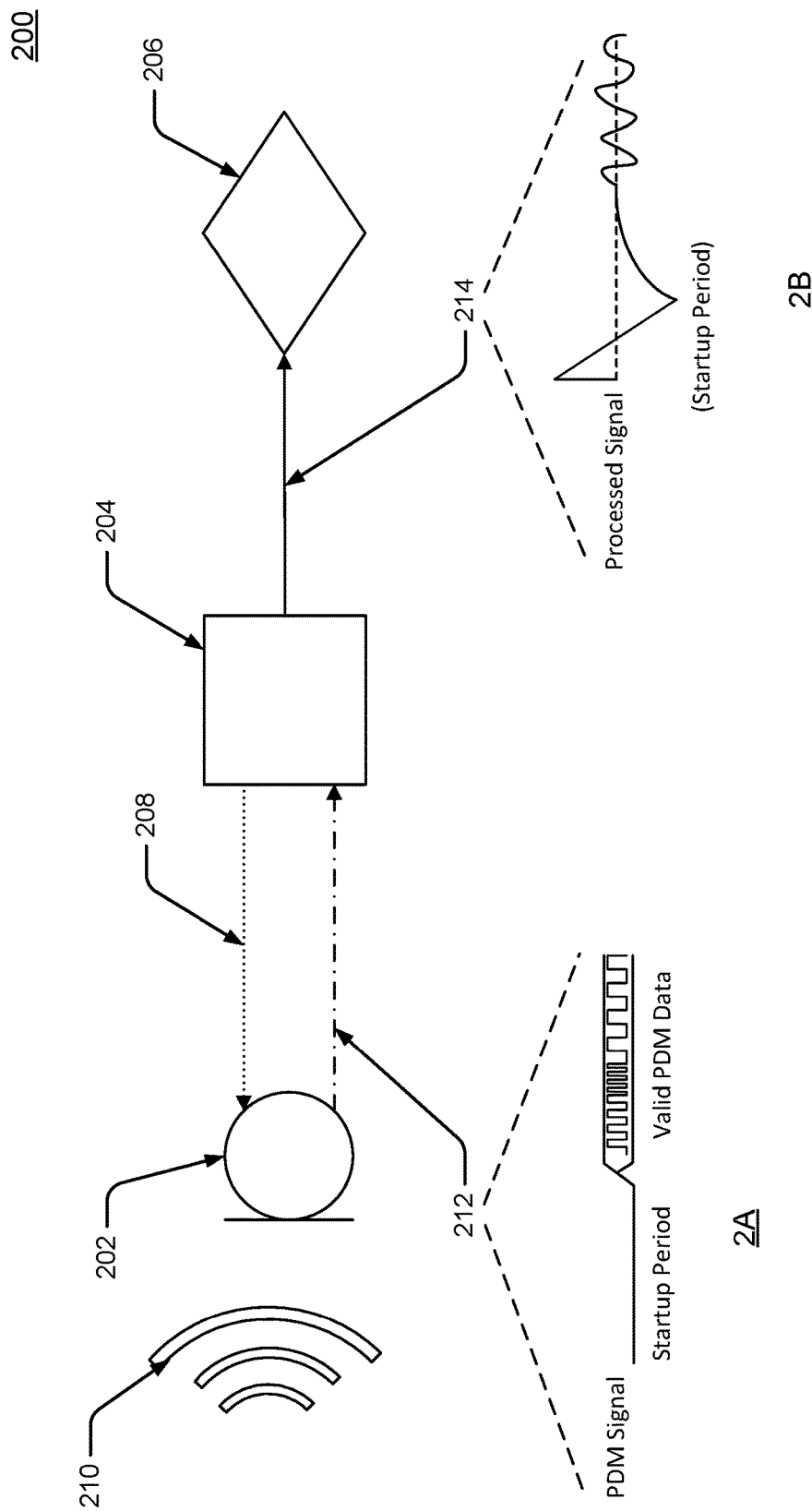
FIG. 2 illustrates an example environment in which techniques for mute pattern injection for a pulse-density modulation microphone can be implemented.

FIG. 2 illustrates an example environment 200 in which techniques for mute pattern injection for a pulse-density modulation microphone can be implemented. The example environment 200 includes a pulse-density modulation (PDM) microphone 202, a signal processing circuit 204, and an output device 206. The PDM microphone 202 receives power and a clock signal 208 from the signal processing circuit 204. The PDM microphone 202 also receives a longitudinal wave 210 and transmits a digital PDM signal 212 to the signal processing circuit 204. In longitudinal waves, the displacement of the medium in which the wave is traveling is parallel to the direction of travel. A longitudinal wave is also known as a compression or pressure wave because the medium through which the wave travels experiences compression and rarefaction as the wave travels through it. Longitudinal waves include sound waves in fluid media, seismic primary waves (P-waves), spring oscillations, and so forth. For example, the longitudinal wave 210 may be a pressure wave such as a sound wave within the range of human hearing, an infrasonic sound wave, an ultrasonic sound wave, and so forth.

The signal processing circuit 204 processes the digital PDM signal 212 and outputs a processed signal 214 to the output device 206. The output device 206 can be any of a variety of devices that can receive or use the processed signal 214, such as a media storage device, a radio frequency transmitter, or a speaker. The PDM microphone 202 converts the longitudinal wave 210 into the digital PDM signal 212. Conceptual representations of the digital PDM signal 212 and the processed signal 214 are shown in views 2A and 2B, respectively. View 2A illustrates the digital PDM signal 212, which includes an example startup period before the valid PDM data begins transmitting. In view 2A, the startup period signal is shown as a flat DC signal at or near a maximum negative amplitude. In other cases, the startup period signal may be a flat DC signal at or near a maximum positive amplitude. View 2B illustrates the processed signal 214 that corresponds to the example signal shown in view 2A, which includes a transient waveform during the startup period prior to the processed form of the valid PDM data.

Example Devices

Figure 3:
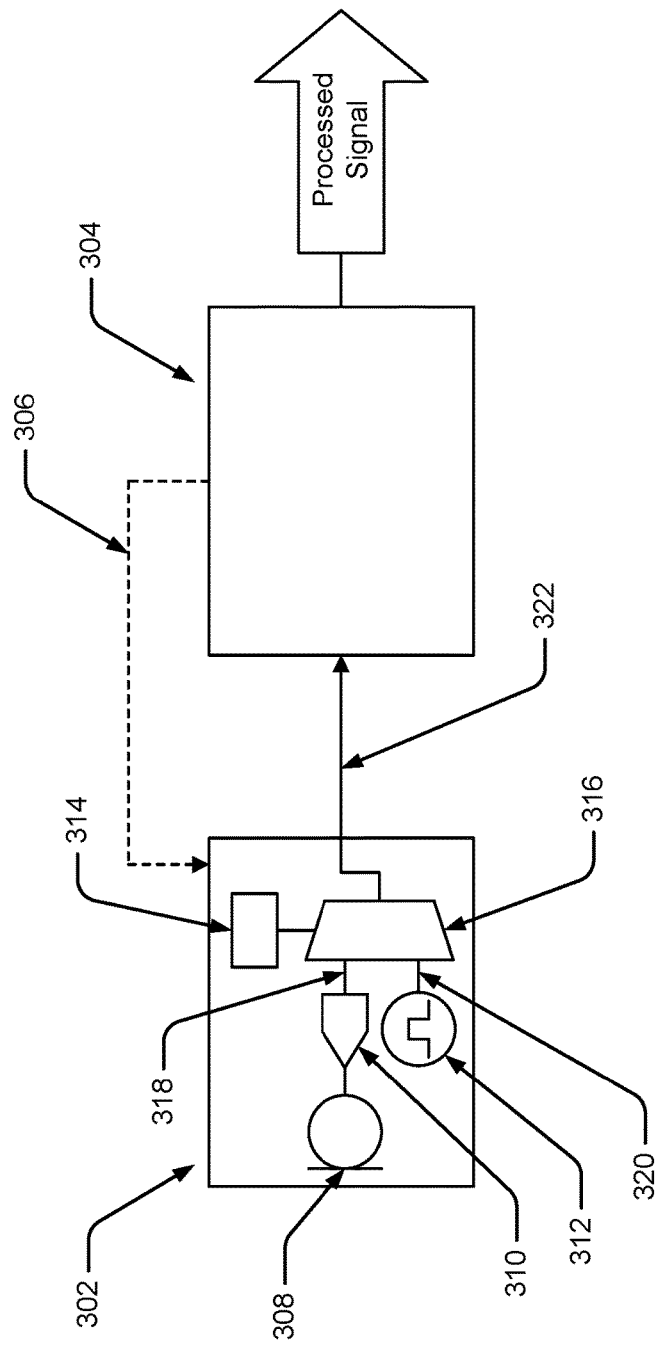
FIG. 3 illustrates an example device in which techniques for mute pattern injection for a pulse-density modulation microphone can be implemented.

FIG. 3 illustrates an example device 300 in which techniques for mute pattern injection for a pulse-density modulation microphone can be implemented. The example device 300 includes a pulse-density modulation (PDM) microphone 302 and a processing circuit 304 that is communicatively connected to the PDM microphone 302. While shown as a single block in FIG. 3, the processing circuit 304 can be any of a variety of configurations of signal processing circuitry. The processing circuit 304 provides power and a clock signal 306 to the PDM microphone 302, receives a digital output 322 from the PDM microphone 302, and can transmit a processed signal (e.g., to another device such as a storage device, a radio frequency transmitter, or a speaker). In some implementations, the processing circuit 304 may be one or more standalone signal processing components connected together to perform various digital signal processing operations. In other implementations, the processing circuit 304 is a single integrated circuit that can perform the signal processing operations. For example, the processing circuit 304 may be a digital signal processor (DSP), an amplifier, a codec, a baseband processor, and so forth.

The PDM microphone 302 includes a transducer 308, an analog-to-digital converter (ADC) 310, a pattern generator 312, a controller 314, and a multiplexer 316. The transducer 308 is configured to receive a pressure wave (e.g., a sound wave) and produce an analog signal that represents the pressure wave. For example, in an electret or microelectromechanical systems (MEMS) microphone, the transducer 308 may be a variable capacitor or a capacitance sensor etched into a silicon wafer. In other types of microphones, the transducer 308 may be a piezoelectric crystal or a mechanical diaphragm.

The ADC 310 is configured to receive the analog signal from the transducer 308 and convert the analog signal to produce a digital PDM signal 318. The ADC 310 may be any of a variety of types (e.g., a sigma-delta converter, an integrating converter, and so forth). The pattern generator 312 is configured to generate a digital mute signal 320 that has a DC average value that may be constant (e.g., zero or a DC offset of the PDM microphone) or may vary over time, within a threshold, and around a target value. The digital mute signal 320 can take any of a variety of forms. In some implementations, the digital mute signal 320 is a single pattern, as described above. In other implementations, also described above, the digital mute signal 320 is a plurality of digital patterns concatenated to form the digital mute signal 320. In implementations comprising multiple digital patterns, each digital pattern has a DC average pattern value that may be constant or may vary over time, within another threshold, and around a pattern target value that can be similar to, or different from, the target value described below. The frequency of the digital mute signal 320 may also take various different values. In some implementations, for example, the digital mute signal 320 has a frequency of at least 10 kilohertz.

The target value is a selected value around which the DC average value of the digital mute signal 320 may vary. The target value can be a single value. For example, in some implementations, the target value may be zero, a DC offset of the PDM microphone 302, a percentage of the DC offset (e.g., a value between 95 percent and 105 percent of the DC offset), and so forth. As noted, a variety of DC average values may be used, so long as the DC average value is small, to avoid a large difference between the DC average value of the digital mute signal and the beginning of the valid data. In other implementations, the target value can be comprised of one or more values. The one or more values can be similar to those described above for a single target value. The threshold and the other threshold are a ranges within which the target value or pattern target value can vary. In some implementations, the threshold or the other threshold is zero (in other words, the target value does not vary substantially).

In other implementations, the threshold can take any of a variety of values, such as a percentage of the target value (e.g., zero to fifteen percent of the target value). Both or either of the target value and the threshold may be programmed into the controller, the pattern generator, or another component. In some implementations, both or either of the target value and the threshold may be determined by the controller, the pattern generator, or another component, based on, for example, properties of the PDM microphone 302 and/or another component. The pattern generator may also or instead be programmed with one or more patterns that include target values and thresholds as inherent parts of the programmed patterns. The pattern target value and the other threshold may also be programmed or determined in similar implementations.

The controller 314 outputs a control signal that causes the multiplexer 316 to transmit either the digital mute signal 320 or the digital PDM signal 318, as described below. The control signal that is output by the controller 314 can be based on a variety of conditions. For example, the controller 314 may include or use a pattern recognition circuit that can recognize one or more particular signals related to the operation of the PDM microphone 302. For example, the pattern recognition circuit may recognize a start/end signal (as described below) or recognize when the digital PDM signal 318 comprises valid data. Generally, a valid PDM signal is a PDM signal comprising enough data to allow the PDM signal to be transmitted, decoded, and converted back into an analog signal that represents the original pressure wave input. Thus, the pattern recognition circuit may recognize invalid data as data that is made up of primarily ones or zeros and recognize other data as comprising a valid signal. Alternatively, the pattern recognition circuit may recognize valid data as data that has integrated DC average value within a range (e.g., a predefined range or a range defined relative to a property of the PDM microphone, such as a DC offset). Responsive to the recognition of valid data, and therefore a valid PDM signal, the pattern recognition circuit outputs the control signal. Note that the control signal can be proximate the recognition of valid data, such as just before, at, or just after the recognition (e.g., 2 ms before or after the recognition). In a case in which the controller 314 outputs the control signal before the digital PDM signal comprises valid data, the controller 314 may output the control signal by recognizing pre-valid data. For instance, the controller 314 may recognize the beginning of a change in the data to valid data from data primarily comprised of ones and zeros. In another case, the controller 314 may recognize that the DC average value of the data, while still outside of the range that defines valid data, is getting closer to the valid range.

In other implementations, the controller 314 can determine a beginning and an end of a muting time interval and output the control signal to indicate the beginning and the end of the muting time interval. The muting time interval is the time during which the multiplexer 316 transmits the digital mute signal 320, as described below. The controller 314 may determine the beginning and end of the muting time interval using any of a variety of methods. For example, the controller 314 may include or use a voltage detector to determine when power is applied to the PDM microphone 302 and/or to determine whether another signal is present (e.g., a start/end signal from another component or the valid digital PDM signal that indicates the end of the muting time interval). These methods may also be implemented using a finite-state machine.

The muting time interval may be based on a startup period of the PDM microphone 302. For example, the startup period may begin when the PDM microphone 302 receives power and the clock signal 306 and end after the multiplexer 316 receives a valid PDM signal from the ADC 310. In other implementations, the muting time interval may be based on other criteria, such as the operating range of the PDM microphone 302. For example, the muting time interval may begin when the digital PDM signal 318 produced by the ADC 310 is outside an operating range of the PDM microphone 302 and end when the digital PDM signal 318 produced by the ADC 310 is within the operating range of the PDM microphone 302. Examples of digital PDM signals 318 that are outside the operating range of the PDM microphone 302 may include a signal based on an input pressure wave that is outside the range of human hearing, a signal that is outside the processing capability of the components of the PDM microphone 302 or of the processing circuit 304, and so forth. This technique provides a digital mute signal 320 that is within the design range until the actual input data (the digital PDM signal 318) comes within the design range.

The multiplexer 316 transmits either the digital mute signal 320 or the digital PDM signal 318 from the PDM microphone 302 to the processing circuit 304. The inputs of the multiplexer 316 are the digital mute signal 320 (from the pattern generator 312) and the digital PDM signal 318 (from the ADC 310). The select input of the multiplexer 316 is connected to receive the control signals from the controller 314. In some implementations, the multiplexer automatically transmits the digital mute signal 320, for instance by default or in response to receiving power and/or a clock signal. After the multiplexer 316 receives a control signal, such as a control signal based on a determination that the digital PDM signal 318 comprises, or is about to comprise, or has just begun to comprise, valid PDM data, the multiplexer 316 stops transmitting the digital mute signal 320 and begins transmitting the digital PDM signal 318. In other implementations, after the multiplexer 316 receives a control signal indicating that the muting time interval has begun, the multiplexer 316 transmits the digital mute signal 320. After the control signal indicates that the muting time interval has ended, the multiplexer 316 stops transmitting the digital mute signal 320 and begins transmitting the digital PDM signal 318.

The described systems and methods may be implemented with a single PDM microphone 302 or multiple PDM microphones 302. For example, the digital PDM signal 318 and the digital mute signal 320 of a single PDM microphone can be synchronized by both being provided on a negative edge of the clock signal 306. Similarly, the described techniques can be used with two PDM microphones 302 by synchronizing the digital PDM signal 318 and the digital mute signal 320 of a first PDM microphone 302 so they are provided on a negative edge of the clock signal. The digital PDM signal 318 and the digital mute signal 320 of a second PDM microphone 302 can be provided on a positive edge of the same clock signal 306. This enables the described techniques to be used with two separate inputs or a stereo input in which the right and left channels are separate inputs.

Additionally, in PDM microphones with a voice activation mode, the described systems and methods enable improved performance and power usage. For example, in some implementations of voice activation, the PDM microphone is periodically turned on by being provided power and a clock signal. If valid data is detected (for example, by the processing circuit 304), the PDM microphone remains on to allow the PDM microphone to receive input. If no valid data is detected, the PDM microphone turns off. Because of the problems caused by the startup period, such as the audible click described above, the PDM microphone has to be in the "on" state for a much longer time to allow a determination of whether there is valid data (e.g., voice data) or just the audible click. The described systems and methods can reduce the frequency and/or severity of startup problems, such as the audible click, which saves power by decreasing the amount of time taken to determine whether the microphone should remain powered.

Figure 4:
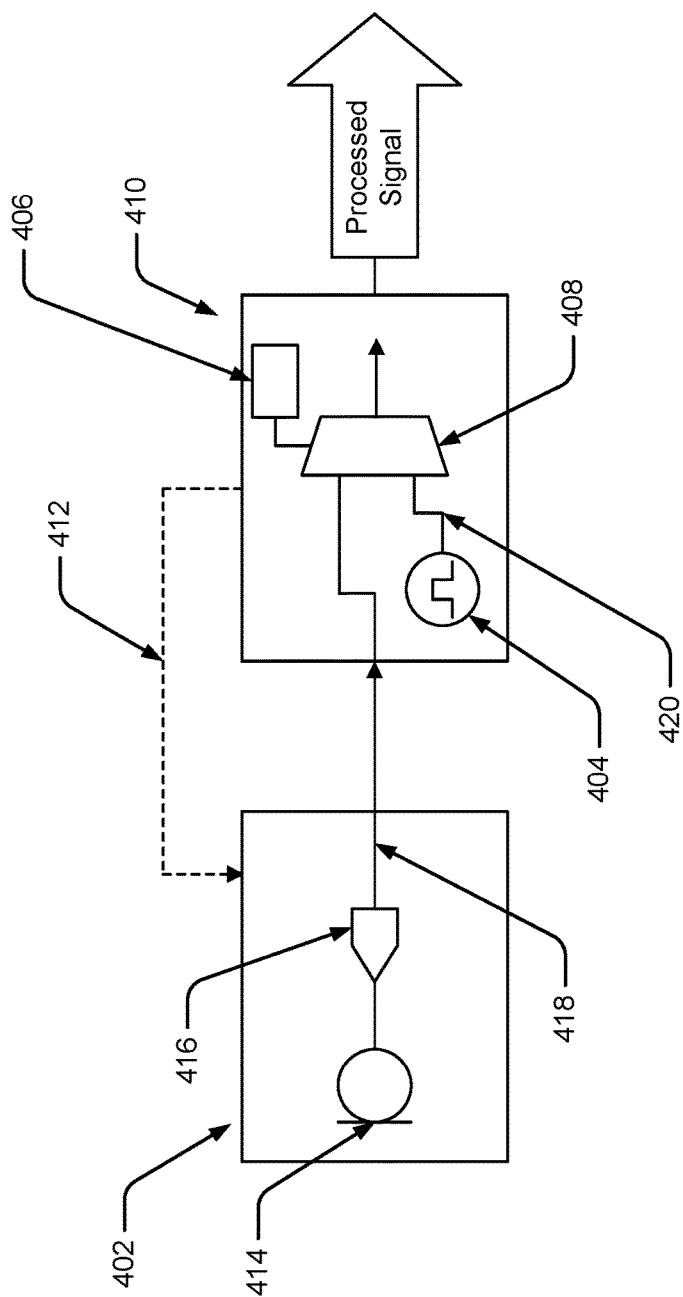
FIG. 4 illustrates an example system in which techniques for mute pattern injection for a pulse-density modulation microphone can be implemented.

FIG. 4 illustrates an example system 400 in which techniques for mute pattern injection for a pulse-density modulation microphone can be implemented. The example system 400 includes a pulse-density modulation (PDM) microphone 402, a pattern generator 404, a controller 406, a multiplexer 408, and a processing circuit 410. The processing circuit 410 is communicatively connected to the PDM microphone 402 and provides power and a clock signal 412 to the PDM microphone 402. The processing circuit 410 also receives a digital output from the PDM microphone 402 (e.g., the digital PDM signal 418), and can transmit a processed signal to another device, such as a storage device, a radio frequency transmitter, or a speaker. For example, the processing circuit 410 may be an integrated circuit such as a digital signal processor (DSP), an amplifier, a codec, a baseband processor, and so forth. In FIG. 4, the pattern generator 404, the controller 406, and the multiplexer 408 are shown as components of a single processing circuit 410. In other implementations, the pattern generator 404, the controller 406, and the multiplexer 408 may be implemented as standalone components or in various combinations as parts of multiple processing circuits 410. In its various configurations, the components of the example system 400 are communicatively connected to each other.

The PDM microphone 402 includes a transducer 414 and an analog-to-digital converter (ADC) 416. The transducer 414 is configured to receive a pressure wave and produce an analog signal that represents the pressure wave. As noted above with reference to FIG. 3, the transducer 414 may be any of a variety of types, depending on the type of PDM microphone 402. The ADC 416 is configured to receive the analog signal from the transducer 414 and convert the analog signal to produce a digital PDM signal 418. As noted, the ADC 416 can be any of a variety of types.

The pattern generator 404 is configured to generate a digital mute signal 320 that has a DC average value that may be constant (e.g., zero or a DC offset of the PDM microphone) or may vary over time, within a threshold, and around a target value. The digital mute signal 420 can take any of a variety of forms, as described above (e.g., a single pattern, a plurality of digital patterns concatenated to form the digital mute signal 420, and so forth). The frequency of the digital mute signal 420 may also take various different values. In some implementations, for example, the digital mute signal 420 has a frequency of at least 10 kilohertz.

The target value is a selected value around which the DC average value of the digital mute signal 420 may vary. As described with reference to FIG. 3, the target value can be a single value or multiple values. For example, in some implementations, the target value or values may be zero, a DC offset of the PDM microphone 402, a percentage of the DC offset, and so forth. The threshold is a range within which the target value can vary. As noted, the threshold can take any of a variety of values, such as zero, a percentage of the target value (e.g., zero to fifteen percent of the target value), and so forth.

The controller 406 outputs a control signal that causes the multiplexer 408 to transmit either the digital mute signal 420 or the digital PDM signal 418, as described above with reference to the controller 314 of FIG. 3. The control signal that is output by the controller 406 can be based on a variety of conditions, such as recognition of a muting time interval, or of a valid digital PDM signal. Examples of control signals based on a muting time interval and based on a valid PDM signal are described above with reference to FIG. 3.

The multiplexer 408 transmits either the digital mute signal 420 or the digital PDM signal 418. The inputs of the multiplexer 408 are the digital mute signal 420 (from the pattern generator 404) and the digital PDM signal 418 (from the ADC 416). The select input of the multiplexer 408 is connected to receive the one or more control signals from the controller 406. In some implementations, the multiplexer automatically transmits the digital mute signal 420, for instance by default or in response to receiving power and/or a clock signal. After the multiplexer 408 receives a control signal, the multiplexer 408 stops transmitting the digital mute signal 420 and begins transmitting the digital PDM signal 418. In other implementations, after the multiplexer 408 receives a control signal (e.g., indicating that the muting time interval has begun), it transmits the digital mute signal 420. After a control signal indicates that the muting time interval has ended, the multiplexer 408 stops transmitting the digital mute signal 420 and begins transmitting the digital PDM signal 418. As noted, the digital PDM signal 418 can be synchronized with the digital mute signal 420 by both being provided on the same edge of the clock signal 412 (e.g., both on the negative edge or both on the positive edge).

As noted with respect to FIG. 3, the described techniques also enable improved performance and power usage in PDM microphone systems with a voice activation mode. For example, in some implementations of the voice activation mode, the PDM microphone (e.g., PDM microphone 402) is periodically turned on, and if valid data is detected (for example, by the processing circuit 304), the PDM microphone remains on. The problems caused by the startup period, such as the audible click described above, require the PDM microphone to be in the "on" state a much longer time to allow a determination of whether there is valid data (e.g., voice data) or just the click. The described systems and methods can reduce the frequency and/or severity of startup problems, such as the audible click, which saves power by decreasing the amount of time taken to determine whether the PDM microphone should stay on.

Figure 5:
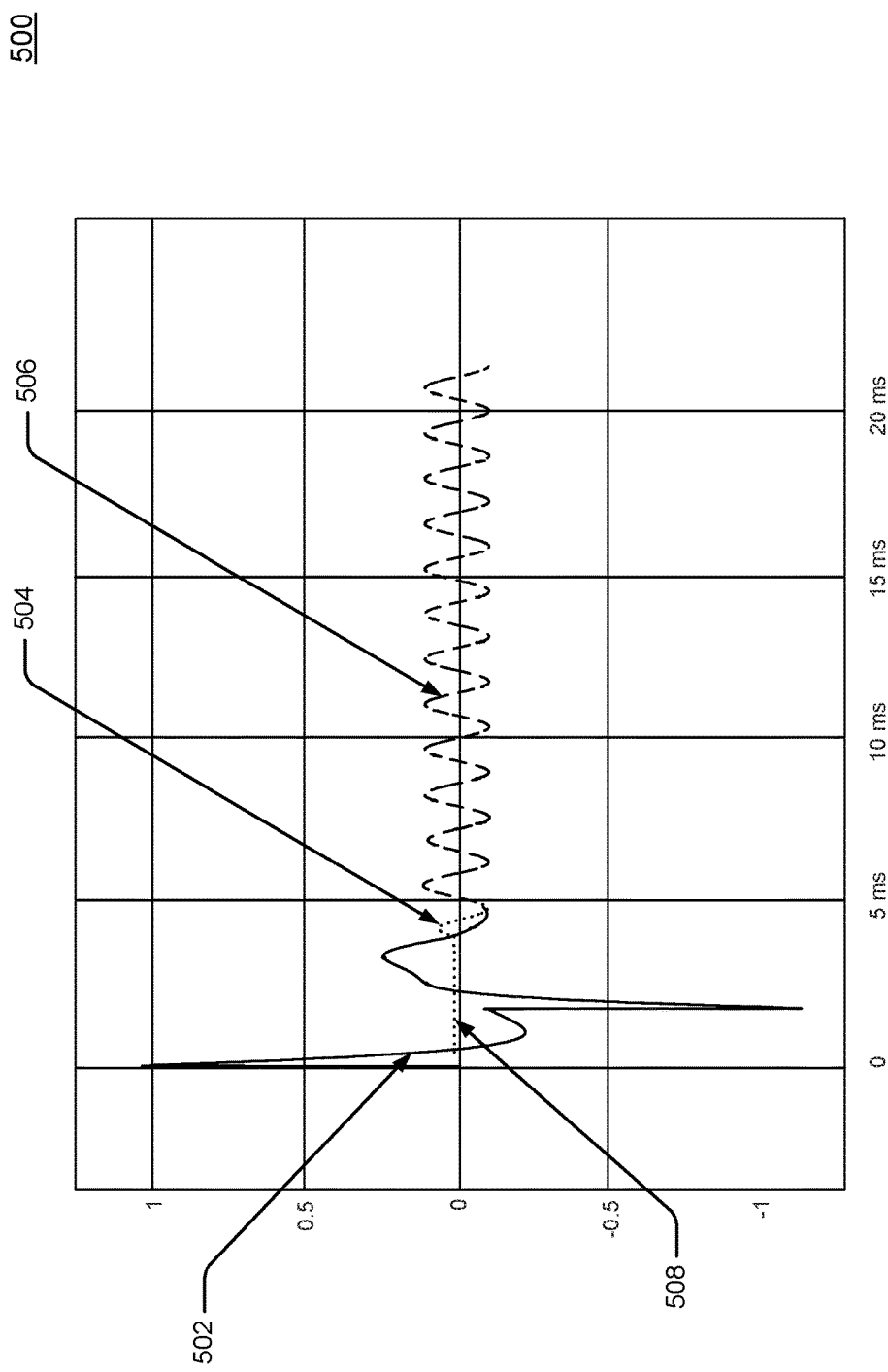
FIG. 5 illustrates, in a graphical format, how the techniques and systems described in FIGS. 3 and 4 may affect a startup period of a digital pulse-density modulation microphone.

FIG. 5 illustrates, in a graphical format, how the techniques and systems described in FIGS. 3 and 4 may affect a startup period of a digital pulse-density modulation microphone. The example output graph 500 shows an example output 502 (illustrated with a solid line) that represents a digital signal, such as the processed signal 214 of FIG. 2, generated by a PDM microphone (e.g., PDM microphone 302 or 402). The example output 502 may be generated when the described methods and systems for mute pattern injection for a pulse-density modulation microphone are not used. Another example output 504 (illustrated with a dotted line) shows the digital signal when the methods and systems for mute pattern injection for a pulse-density modulation microphone are used. The outputs 502 and 504 were decimated down to normal audio bandwidth (<20 kilohertz) prior to generating the example output graph 500. The example output graph 500 shows that it takes about four milliseconds (ms) between time zero on the horizontal axis, when power and a clock signal are applied, and the time when the digital signal comprises valid data. Note that around the 5 ms point on the horizontal axis, the example output 502 and the example output 504 begin to have substantially the same shape, and both example outputs 502 and 504 are represented by a single valid data signal 506 (illustrated with a dashed line). During the approximately four ms period (e.g., the startup period described above), the example output 502 includes a transient component with a large positive spike and a large negative spike, which correspond to the audible click described above. In contrast, the other example output 504 includes a digital mute signal 508, illustrated as the flat dotted line near the zero point of the vertical axis, that begins near time zero and ends after about four ms. The digital mute signal 508 corresponds to the digital mute signals 320 and 420 of FIGS. 3 and 4, respectively.

Example Methods

With the structure of the example device 300 and the example system 400 detailed, the discussion turns to techniques for implementing mute pattern injection for a pulse-density modulation microphone. These techniques can be implemented using the previously described apparatuses and example configurations such as the example pulse-density modulation (PDM) microphone 302 and/or the example system 400.

Figure 6A:
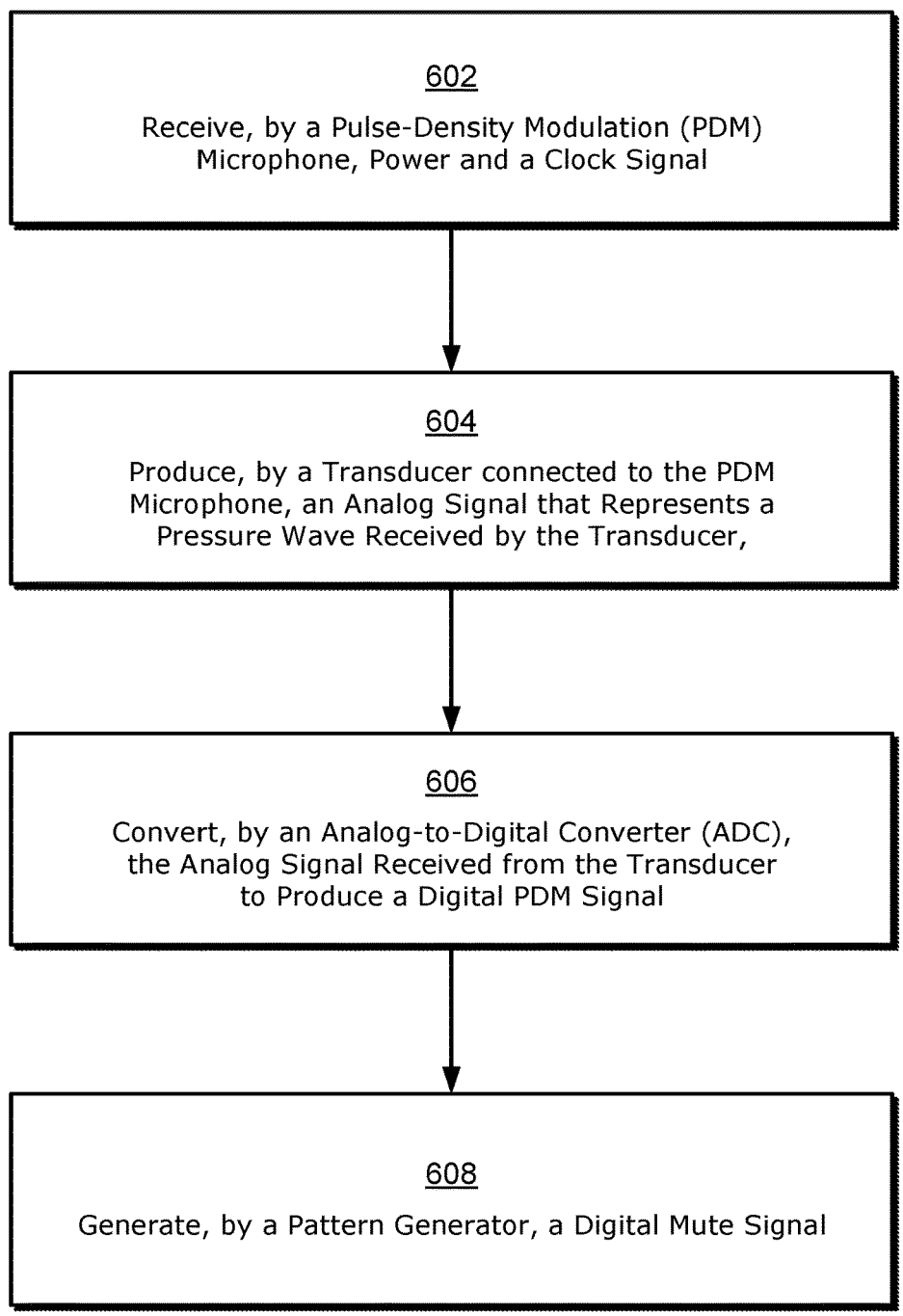
FIG. 6A depicts a method for implementing mute pattern injection for a pulse-density modulation microphone in accordance with one or more aspects.
Figure 6B:
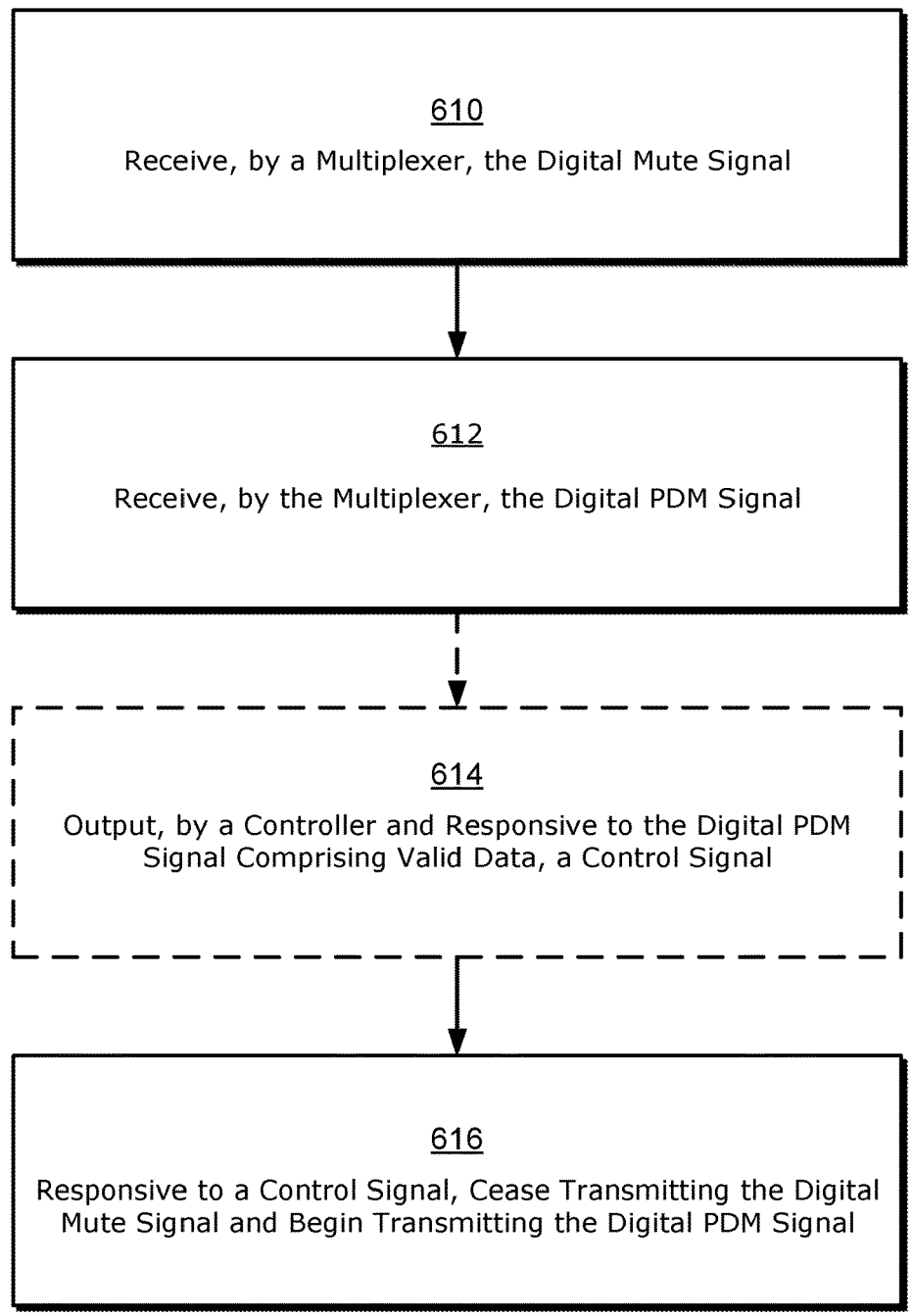
FIG. 6B illustrates additional steps of the method of FIG. 6A.

These techniques include methods illustrated in FIGS. 6A and 6B, operations of which are not necessarily limited to the orders shown. The operations can be looped, repeated, or re-ordered to implement various aspects described herein. Further, these methods may be used in conjunction with other methods, in whole or in part, whether performed by the same entity, separate entities, or any combination thereof. In portions of the following discussion, reference will be made to the concepts, example devices, and example systems shown in FIGS. 1-5. Such reference is not to be taken as limiting the subject matter herein to any example configurations, but rather as illustrative of one of a variety of examples.

FIG. 6A depicts a method 600 for implementing mute pattern injection for a pulse-density modulation microphone in accordance with one or more aspects. The method 600 may be used in conjunction with a PDM microphone system that includes a transducer, an analog-to-digital converter (ADC), a pattern generator, and a multiplexer (e.g., the example PDM microphone 302 or the example system 400). The PDM microphone system may also include a controller.

At 602, power and a clock signal are received by the PDM microphone. The power and clock signal are transmitted by a processing circuit communicatively connected to the PDM microphone. The processing circuit can transmit a processed signal (e.g., to another device such as a storage device, a radio frequency transmitter, or a speaker). The processing circuit may be one or more standalone signal processing components connected together to perform various digital signal processing operations or a single integrated circuit that can perform the signal processing operations. For example, the processing circuit may be a digital signal processor (DSP), an amplifier, a codec, a baseband processor, and so forth.

At 604, the transducer receives a pressure wave and produces an analog signal that represents the pressure wave. The transducer may be any of a variety of types. For example, in an electret or microelectromechanical systems (MEMS) microphone, the transducer may be a variable capacitor or a capacitance sensor etched into a silicon wafer. In other types of microphones, the transducer may be a piezoelectric crystal or a mechanical diaphragm.

At 606, the ADC receives the analog signal from the transducer and converts the analog signal to produce a digital PDM signal. The ADC may be any of a variety of types (e.g., a sigma-delta converter, an integrating converter, and so forth).

At 608, the pattern generator, in response to the PDM microphone receiving the clock signal, generates a digital mute signal that has a DC average value that may be constant (e.g., zero or a DC offset of the PDM microphone) or may vary over time, within a threshold, and around a target value. The digital mute signal can take any of a variety of forms. For example, the digital mute signal may be a single pattern or a plurality of digital patterns concatenated to form the digital mute signal. In implementations comprising multiple digital patterns, each digital pattern has a DC average pattern value that varies over time, within another threshold, and around a pattern target value that can be similar to, or different from, the target value described below. The frequency of the digital mute signal may also take various different values (e.g., at least 10 kilohertz).

The target value is a selected value around which the DC average value of the digital mute signal may vary. In some implementations, the target value may be a single value such as zero, a DC offset of the PDM microphone, a percentage of the DC offset (e.g., a value between 95 percent and 105 percent of the DC offset), and so forth. In other implementations, the target value can be comprised of one or more values that may be similar to those described above for a single target value. The threshold is a range within with the target value or pattern target value can vary and can take any of a variety of values. For example, the threshold can be zero, a percentage of the target value (e.g., zero to fifteen percent of the target value), and so forth.

FIG. 6B illustrates additional steps of the method 600 of FIG. 6A.

At 610, the multiplexer receives, as a signal input, the digital mute signal from the pattern generator.

At 612, the multiplexer receives, as a signal input, the digital PDM signal (from the ADC).

At 614, the controller, optionally and responsive to the digital PDM signal comprising valid data, outputs a control signal. The determination of valid data may be made using any of a variety of techniques, such as those discussed above with reference to FIGS. 3 and 4. Alternatively, the controller may determine a beginning and an end of a muting time interval and output a control signal indicating the beginning and the end of the muting time period. The controller may determine the beginning and end of the muting time interval using any of a variety of methods, as described above with respect to FIGS. 3 and 4.

At 616, responsive to receiving a control signal via a select input (e.g. the optional control signal of step 614), the multiplexer ceases to transmit the digital mute signal and begins to transmit the digital PDM. As noted, the digital PDM signal can be synchronized with the digital mute signal by both being provided on the same edge of the clock signal (e.g., both on the negative edge or both on the positive edge).

As noted, the method 600 may be used in conjunction with a PDM microphone system that includes a transducer, an analog-to-digital converter (ADC), a pattern generator, a controller, and a multiplexer. In some implementations (e.g., the example PDM microphone 302), the PDM microphone system is contained within the PDM microphone package. Other implementations, (e.g., the example system 400), include a PDM microphone in which the pattern generator, the controller, and the multiplexer are separate from the PDM microphone. In either implementation, the multiplexer transmits the digital mute pattern and/or the digital PDM signal to a processing circuit that can perform processing operations on the digital mute pattern and the digital PDM signal and transmit the resulting processed signal to any of a variety of other devices, such as storage device, a radio frequency transmitter, a speaker, and so forth. As noted, the processing circuit may be an integrated circuit such as a digital signal processor (DSP), an amplifier, a codec, a baseband processor, and so forth. The processing circuit may include the pattern generator, the controller, and/or the multiplexer or those elements may be implemented as standalone components or in various combinations as parts of multiple different processing circuits.

Example Systems

Figure 7:
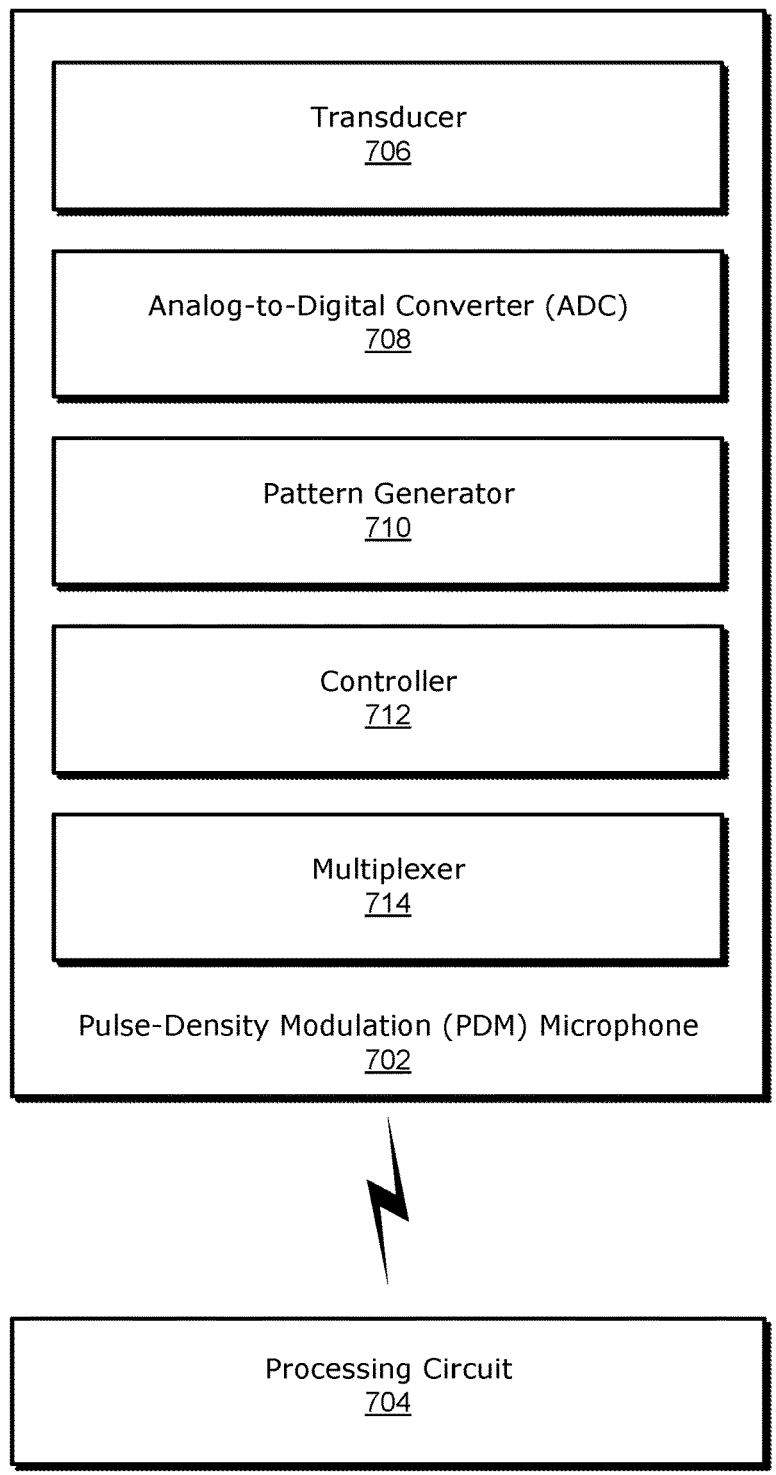
FIG. 7 is a block diagram that illustrates an example pulse-density modulation (PDM) microphone system that is representative of one or more systems and/or devices that may implement the various techniques described herein.

FIG. 7 is a block diagram that illustrates an example pulse-density modulation (PDM) microphone system 700 generally, including a PDM microphone that is representative of one or more systems and/or devices that may implement the various techniques described herein. The example PDM microphone system 700 includes a PDM microphone 702 and a processing circuit 704. The PDM microphone 702 and the processing circuit 704 may be any of a variety of devices that can implement mute pattern injection for a pulse-density modulation microphone (e.g., the example PDM microphones 302 or 402 and the processing circuits 304 or 410 of FIGS. 3 and 4, respectively).

The PDM microphone 702 may also include a transducer 706, an analog-to-digital converter (ADC) 708, a pattern generator 710, a controller 712, and a multiplexer 714. The transducer 706 is representative of components that can receive a mechanical input, such as a pressure wave, and produce an analog signal that represents the mechanical input. For example, the transducer may be a variable capacitor, a capacitance sensor etched into a silicon wafer, a piezoelectric crystal, a mechanical diaphragm, and so forth.

The ADC 708 is representative of components that can convert an analog signal into a digital signal (e.g., into a digital PDM signal). The ADC 708 may be any of a variety of types of converter that can perform this conversion, such as a sigma-delta converter. The pattern generator 710 is representative of components that can generate a digital signal with a selectable pattern (e.g., "1 0 1 0 1 0 . . . " or "1 0 0 1 1 0 . . . " and so forth).

The controller 712 is representative of components that can provide processing, communication, or analytical functionality or associated operations using hardware. The controller 712 may be a microprocessor or a microcontroller that includes memory, processors, and/or communication capability. The multiplexer 714 is representative of components that can select one of a plurality of input signals, based on one or more selection criteria, and transmit the selected input on a single output line.

In at least some aspects, the transducer 706 and the ADC 708 provide means to receive a longitudinal wave, produce an analog signal that represents the longitudinal wave, and convert the analog signal to produce a digital PDM signal. Further, in at least some aspects, the pattern generator 710 provides means to generate a digital mute signal that has a DC average value that may be a constant (e.g., zero or a DC offset of the PDM microphone) or may vary over time, within a threshold, and around a target value. Additionally, in at least some aspects, the controller 712 provides means to determine a beginning and an end of a muting time interval and to output one or more control signals indicating the beginning and the end of the muting time interval. In at least some aspects, the multiplexer 714 provides means to receive the control signals, the digital mute signal, and the digital PDM signal. The multiplexer 714 also provides means to, responsive to the control signals indicating the muting time interval has begun, transmit the digital mute signal during the muting time interval and means to, responsive to the signals indicating the muting time interval has ended, cease transmitting the digital mute signal and begin transmitting the digital PDM signal.

The processing circuit 704 is representative of components that can perform processing operations on the digital mute pattern and the digital PDM signal and transmit the resulting processed signal to any of a variety of other devices, such as storage device, a radio frequency transmitter, a speaker, and so forth. The processing circuit 704 may be an integrated circuit such as a digital signal processor (DSP), an amplifier, a codec, a baseband processor, and so forth. In some implementations, the processing circuit 704 may include various components of the PDM microphone (e.g., the pattern generator 710, the controller 712, and/or the multiplexer 714).

In at least some aspects, the processing circuit 704 provides means to send, receive, and modify signals between the various components of the PDM microphone 702 and the processing circuit 704 (e.g., a clock signal, the digital mute pattern, the digital PDM signal, and so forth). Additionally, in at least some aspects the processing circuit 704 provides means to perform processing operations on the digital mute pattern and the digital PDM signal and transmit the resulting processed signal to any of a variety of other devices, such as storage device, a radio frequency transmitter, a speaker, and so forth.

The techniques and devices described with reference to FIGS. 1-6B may be used to enable PDM microphone designs that overcome the electronic and/or audio problems introduced by the startup period inherent to conventional PDM microphones, as described above. The techniques do not require additional components in the digital signal processing chain, thereby saving space and processing resources. Further, the digital mute signal solutions described in these techniques and methods do not require tuning or customization for the particular PDM microphone in which the solutions are used. Instead, the solution can be successfully implemented without prior knowledge of the microphone properties, even though the length of the startup period can vary between microphones.

Although subject matter has been described in language specific to structural features or methodological operations, it is to be understood that the subject matter defined in the appended claims is not necessarily limited to the specific features or operations described above, including not necessarily being limited to the organizations in which features are arranged or the orders in which operations are performed.

What is claimed is:

1. A pulse-density modulation (PDM) microphone, comprising:
   a transducer configured to receive a pressure wave and produce an analog signal that represents the pressure wave;
   an analog-to-digital converter (ADC) configured to receive the analog signal from the transducer and convert the analog signal to produce a digital PDM signal;
   a pattern generator configured to generate a digital mute signal, the digital mute signal comprising a digital signal with a DC average value that varies over time, within a threshold, and around a target value; and
   a multiplexer configured to:
      receive the digital mute signal from the pattern generator; and
      receive the digital PDM signal from the ADC and, responsive to a control signal, stop transmitting the digital mute signal and begin transmitting the digital PDM signal.

2. The PDM microphone of claim 1, further comprising a controller configured to output the control signal responsive to the digital PDM signal comprising valid PDM data.

3. The PDM microphone of claim 2, wherein the pattern generator, the controller, and the multiplexer are components of a single integrated circuit that is communicatively connected to the PDM microphone.

4. The PDM microphone of claim 1, wherein the target value is a DC offset of the PDM microphone.

5. The PDM microphone of claim 1, wherein the target value comprises one or more values, each value being between 95 percent and 105 percent of a DC offset of the PDM microphone.

6. The PDM microphone of claim 1, wherein the threshold is between zero and fifteen percent of the target value.

7. The PDM microphone of claim 1, wherein the digital mute signal comprises a plurality of digital patterns concatenated to form the digital mute signal, each digital pattern having a DC average pattern value that varies over time, within another threshold, and around a pattern target value for each digital pattern.

8. The PDM microphone of claim 1, further comprising a controller configured to determine a muting time interval and output one or more control signals indicating a duration of the muting time interval and wherein:
the multiplexer is further configured to transmit the digital mute signal during the muting time interval; and
the muting time interval is:
a startup period of the PDM microphone that begins after the PDM microphone receives power and a clock signal and ends after the multiplexer receives a valid PDM signal from the ADC; or
a time period that begins after the digital PDM signal produced by the ADC is outside an operating range of the PDM microphone and ends after the digital PDM signal produced by the ADC is within the operating range of the PDM microphone.

9. The PDM microphone of claim 1, wherein the digital mute signal and the digital PDM signal are synchronized by:
both being provided on a negative edge of a clock signal; or
both being provided on a positive edge of the clock signal.

10. A method for injecting a signal in a pulse-density modulation (PDM) microphone system that includes a pattern generator, a multiplexer, and a PDM microphone that includes a transducer and an analog-to-digital converter (ADC), the method comprising:
receiving, by the PDM microphone, power and a clock signal;
producing, by the transducer, an analog signal that represents a pressure wave received by the transducer;
converting, by the ADC, the analog signal received from the transducer to produce a digital PDM signal;
generating, by the pattern generator, a digital mute signal, the digital mute signal comprising a digital signal with a DC average value that varies over time, within a threshold, and around a target value;
receiving, by the multiplexer, the digital mute signal; and
receiving, by the multiplexer, the digital PDM signal and, responsive to a control signal, ceasing to transmit the digital mute signal and beginning to transmit the digital PDM signal.

11. The method of claim 10, wherein the digital PDM microphone further includes a controller, and the method further comprises:
outputting, by the controller and responsive to the digital PDM signal comprising valid PDM data, the control signal.

12. The method of claim 11, wherein the pattern generator, the controller, and the multiplexer are components of a single integrated circuit that is communicatively connected to the PDM microphone.

13. The method of claim 10, wherein the target value is a DC offset of the PDM microphone.

14. The method of claim 10, wherein the target value comprises one or more values, each value being between 95 percent and 105 percent of a DC offset of the PDM microphone.

15. The method of claim 10, wherein the threshold is between zero and fifteen percent of the target value.

16. The method of claim 10, wherein the digital mute signal comprises a plurality of digital patterns concatenated to form the digital mute signal, each digital pattern having a DC average pattern value that varies over time, within another threshold, and around a pattern target value for each digital pattern.

17. The method of claim 10, wherein:
the PDM microphone further includes a controller configured to determine a muting time interval and output the control signal, the control signal indicates a duration of the muting time interval, and the muting time interval comprises:
a startup period of the PDM microphone that begins after the PDM microphone receives power and the clock signal and ends after the multiplexer receives a valid PDM signal from the ADC; or
a time period that begins after the digital PDM signal produced by the ADC is outside an operating range of the PDM microphone and ends after the digital PDM signal produced by the ADC is within the operating range of the PDM microphone; and further comprising:
transmitting the digital mute signal during the muting time interval; and
transmitting the digital PDM signal after the muting time interval ends.

18. The method of claim 10, wherein the transmitting, by the multiplexer, the digital mute signal and the digital PDM signal transmits to an integrated circuit that processes the digital mute signal and the digital PDM signal.

19. The method of claim 10, wherein the method further comprises synchronizing the digital mute signal and the digital PDM signal by:
providing both the digital mute signal and the digital PDM signal on a negative edge of a clock signal; or
providing both the digital mute signal and the digital PDM signal on a positive edge of the clock signal.

20. A system, comprising:
a pattern generator configured to generate a digital mute signal, the digital mute signal comprising a digital signal with a DC average value that varies over time, within a threshold, and around a target value; and
a multiplexer configured to:
receive the digital mute signal from the pattern generator; and
receive a digital PDM signal and, responsive to a control signal, stop transmitting the digital mute signal and begin transmitting the digital PDM signal.

21. The system of claim 20, further comprising a controller configured to output the control signal responsive to the digital PDM signal comprising valid PDM data.

22. The system of claim 21, wherein the pattern generator, the controller, and the multiplexer are components of a single integrated circuit that is communicatively connected to a PDM microphone.

23. The system of claim 20, wherein the target value is a DC offset of a PDM microphone.

24. The system of claim 20, wherein the target value comprises one or more values, each value being between 95 percent and 105 percent of a DC offset of a PDM microphone.

25. The system of claim 20, wherein the threshold is between zero and fifteen percent of the target value.

26. The system of claim 20, wherein the digital mute signal and the digital PDM signal are synchronized by:
both being provided on a negative edge of a clock signal; or
both being provided on a positive edge of the clock signal.

27. The system of claim 20, wherein the digital mute signal has a frequency of at least 10 kilohertz.

28. The system of claim 20, wherein the digital mute signal is a plurality of digital patterns concatenated to form the digital mute signal, each digital pattern having a DC average pattern value that varies over time, within another threshold, and around a pattern target value for each digital pattern.

29. The system of claim 20, wherein the digital mute signal has a frequency of less than 10 kilohertz.

30. A pulse-density modulation (PDM) microphone, comprising:
- a transducer configured to receive a longitudinal wave and produce an analog signal that represents the longitudinal wave;
- an analog-to-digital converter (ADC) configured to receive the analog signal from the transducer and convert the analog signal to produce a digital PDM signal;
- a pattern generator configured to generate a digital mute signal that has a DC average value that varies over time, within a threshold, and around a DC offset of the PDM microphone; and
- means for:
    - receiving the digital mute signal from the pattern generator and
    - receiving the digital PDM signal from the ADC and, responsive to a control signal, stop transmitting the digital mute signal and begin transmitting the digital PDM signal.

* * * * *